(12) United States Patent
Lin et al.

(10) Patent No.: US 12,727,077 B2
(45) Date of Patent: Sep. 1, 2026

(54) MICRO CIRCUIT STRUCTURE AND MANUFACTURING METHOD THEREOF

(71) Applicant: KINSUS INTERCONNECT TECHNOLOGY CORP., Taoyuan City (TW)

(72) Inventors: Ting-Hao Lin, Taoyuan City (TW); Chiao-Cheng Chang, Taoyuan City (TW); Chien-Wei Chang, Taoyuan City (TW)

(73) Assignee: KINSUS INTERCONNECT TECHNOLOGY CORP., Taoyuan City (TW)

( * ) Notice: Subject to any disclaimer, the term of this patent is extended or adjusted under 35 U.S.C. 154(b) by 294 days.

(21) Appl. No.: 18/671,338

(22) Filed: May 22, 2024

(65) Prior Publication Data

US 2025/0247954 A1 Jul. 31, 2025

(30) Foreign Application Priority Data

Jan. 29, 2024 (TW) ................................ 113103414

(51) Int. Cl.
*H05K 1/02* (2006.01)
*H05K 3/38* (2006.01)

(52) U.S. Cl.
CPC ........... *H05K 1/0296* (2013.01); *H05K 3/386* (2013.01); *H05K 2201/10984* (2013.01); *H05K 2203/0353* (2013.01)

(58) Field of Classification Search
CPC ................. H05K 3/386; H05K 1/0296; H05K 2201/10984; H05K 2203/0354
See application file for complete search history.

(56) References Cited

U.S. PATENT DOCUMENTS

2004/0213954 A1* 10/2004 Bourdelais ............ H05K 3/107 428/119
2008/0095985 A1* 4/2008 Frey ...................... H05K 3/061 428/338
2016/0282982 A1* 9/2016 Hwang ................ H05K 1/0296
2022/0124906 A1* 4/2022 Lee ...................... H05K 1/0296

FOREIGN PATENT DOCUMENTS

WO WO-2018066203 A1 * 4/2018 .............. H10P 14/46

* cited by examiner

*Primary Examiner* — Nathan Milakovich
(74) *Attorney, Agent, or Firm* — Juan Carlos A. Marquez; Marquez IP Law Office, PLLC

(57) ABSTRACT

A micro circuit structure includes a circuit substrate, a circuit pattern layer, and a fixed layer. A first surface of the circuit substrate has a plurality of recessed portions. The circuit pattern layer is formed on the first surface of the circuit substrate. The circuit pattern layer includes a plurality of circuit patterns, a gap between the circuit patterns is less than 10 μm, and each of the circuit patterns is located between two recessed portions. The fixed layer is formed on the first surface of the circuit substrate and between the circuit patterns, where a second surface of the circuit pattern is exposed to a third surface of the fixed layer. By arranging the recessed portions between the circuit patterns, residual metal substances can be removed to avoid a short circuit caused by conduction, and a problem of electron-migration.

12 Claims, 3 Drawing Sheets

MICRO CIRCUIT STRUCTURE AND MANUFACTURING METHOD THEREOF

CROSS-REFERENCE TO RELATED APPLICATION

This non-provisional application claims priority under 35 U.S.C. § 119 (a) to patent application No. 113103414 filed in Taiwan, R.O.C. on Jan. 29, 2024, the entire contents of which are hereby incorporated by reference.

BACKGROUND

Technical Field

The present invention relates to the field of circuit board manufacturing, and in particular, to a thin circuit structure and a manufacturing method thereof.

Related Art

With evolution of technologies for a wafer manufacturing process, performance requirements such as wafer wiring density, a transmission rate and signal interference increase, and correspondingly, a size of a terminal chip is reduced and a spacing of chip pins is also reduced. Correspondingly, a circuit board industry also develops in a direction of circuit size refinement, circuit multi-layering, and three-dimensional stacking.

Since an exposed circuit pattern on a circuit substrate during a manufacturing process/or a final stage is reduced in a size, due to a small contact area with the substrate, the exposed circuit pattern is susceptible to external forces, causing skewing or even peeling. This affects electrical properties of a final product. In addition, due to size reduction, control of etching and cleaning also needs to be finer. Currently, during manufacturing, it is still found that there may be tiny particles remaining in a local region. This may cause a micro short circuit between circuits or an electro-migration phenomenon.

SUMMARY

To resolve a problem in the prior art, a micro circuit structure is provided. In some embodiments, the micro circuit structure includes a circuit substrate, a circuit pattern layer, and a fixed layer. A first surface of the circuit substrate has a plurality of recessed portions. The circuit pattern layer is formed on the first surface of the circuit substrate. The circuit pattern layer includes a plurality of circuit patterns, a gap between the circuit patterns is less than 10 μm, and each of the circuit patterns is located between two recessed portions. The fixed layer is formed on the first surface of the circuit substrate and between the circuit patterns, where a second surface of the circuit pattern is exposed to a third surface of the fixed layer.

In some embodiments, a width of each of the circuit patterns is less than 10 μm.

In some embodiments, the fixed layer is selected from a group including a thermosetting adhesive, a light curing adhesive, or solder mask.

In some embodiments, the second surface of the circuit pattern is coplanar with the third surface of the fixed layer.

In some embodiments, the circuit pattern protrudes from the third surface of the fixed layer.

A manufacturing method for a micro circuit structure is further provided. In some embodiments, the manufacturing method for a micro circuit structure includes: providing a circuit substrate; forming a circuit pattern layer on a first surface of the circuit substrate, where the circuit pattern layer includes a plurality of circuit patterns, and a gap between the circuit patterns is less than 10 μm; performing etching between the circuit patterns, to remove a part of the first surface, and form a recessed portion between two circuit patterns; coating a curing material on the circuit substrate and the circuit pattern layer, and filling the curing material between the circuit patterns and in the recessed portion; and removing a part of the curing material to form a fixed layer, to enable a second surface of the circuit pattern to be exposed to a third surface of the fixed layer.

In some embodiments, a width of each of the circuit patterns is less than 10 μm.

In some embodiments, the fixed layer is selected from a group including a thermosetting adhesive, a light curing adhesive, or solder mask.

In some embodiments, the second surface of the circuit pattern is coplanar with the third surface of the fixed layer.

In some embodiments, the circuit pattern protrudes from the third surface of the fixed layer.

In some embodiments, the etching is selected from a group including laser etching, plasma etching, electron beam etching, and chemical etching.

In some embodiments, the step of removing the part of the curing material is selected from a group including grinding, plasma etching, laser etching, and chemical etching.

As described in the foregoing embodiments, by forming the recessed portion between the circuit patterns, residual metal particles or metal films are removed to avoid a micro short circuit, and electro-migration is further restricted through a structure of the recessed portion.

DETAILED DESCRIPTION

It should be understood that when a component is referred to as being "arranged" on another component, it may indicate that the component is directly located on the another component, or an intermediate component may exist, and the component is connected to the another component through the intermediate component. On the contrary, when a component is referred to as being "directly on another component" or "directly arranged on another component", it may be understood that in this case, it is clearly defined that there is no intermediate component.

In addition, terms "first", "second", and "third" are merely used to distinguish one component, part, region, layer, or portion from another component, part, region, layer, or portion, rather than indicating a necessary order. In addition, relative terms such as "lower" and "upper" may be used herein to describe a relationship between one component and another component. It should be understood that the relative terms are intended to include different orientations of devices in addition to the orientations depicted in the figures. For example, if a device in one accompanying drawing is flipped, a component described as being on a "lower" side of another component is oriented on an "upper" side of the another component. This only indicates a relative orientation relationship rather than an absolute orientation relationship.

Figure 1:
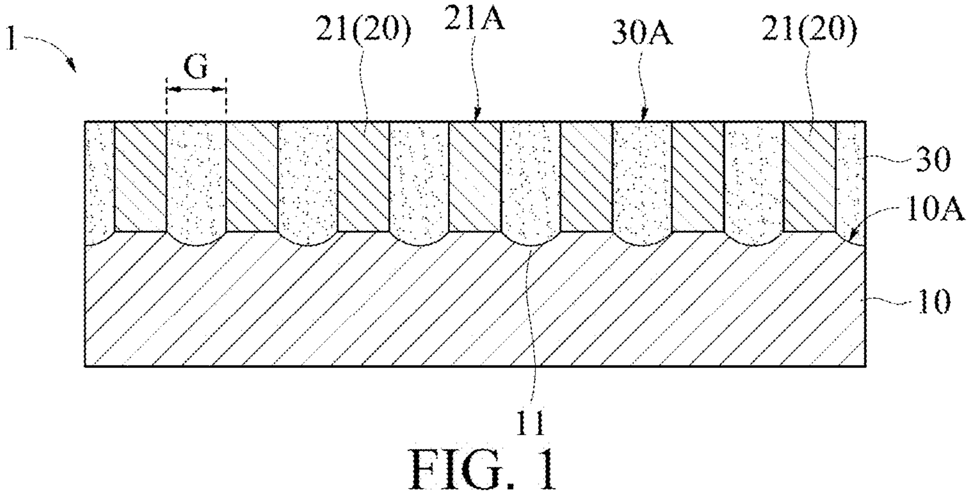
FIG. 1 is a schematic cross-sectional view of a first embodiment of a micro circuit structure.

FIG. 1 is a schematic cross-sectional view of a first embodiment of a micro circuit structure. As shown in FIG. 1, in some embodiments, a micro circuit structure 1 includes a circuit substrate 10, a circuit pattern layer 20, and a fixed layer 30. The circuit substrate 10 may be a part of the substrate in a manufacturing process, or it may be an entire circuit substrate. Although not shown in the figure, it may be understood that the circuit substrate 10 may include inner multi-layer circuits. A first surface 10A of the circuit substrate 10 has a plurality of recessed portions 11. The recessed portion 11 may be formed through dry etching such as laser etching, plasma etching, or electron beam etching, or may be formed, based on chemical properties, through chemical etching by using a substrate material without damaging a circuit pattern 21. Its purpose is to remove residual metal particles or metal films to avoid a micro short circuit, and restrict electro-migration through a recessed structure.

The circuit pattern layer 20 is formed on the first surface 10A of the circuit substrate 10. The circuit pattern layer 20 includes a plurality of circuit patterns 21, a gap G between the circuit patterns 21 is less than 10 μm, and each of the circuit patterns 21 is located between two recessed portions 11. In more detail, in some embodiments, a width of the circuit pattern 21 is less than 10 μm. The circuit pattern 21 may be an inner circuit of an overall structure, or may be an outermost circuit, for example, a goldfinger contact, and a solder pad.

The fixed layer 30 is formed on the first surface 10A of the circuit substrate 10 and between the circuit patterns 21 to fill the recessed portion 11. The circuit pattern 21 can be stabilized through the fixed layer 30 to prevent the circuit pattern 21 from falling over or peeling off during subsequent processing. A second surface 21A of each of the circuit patterns 21 is exposed to a third surface 30A of the fixed layer 30. In a first embodiment, the second surface 21A of the circuit pattern 21 is coplanar with the third surface 30A of the fixed layer 30, which is in a form of circuit embedment. In more detail, in some embodiments, the fixed layer 30 may be a thermosetting adhesive, a light curing adhesive, or solder mask.

Figure 2:
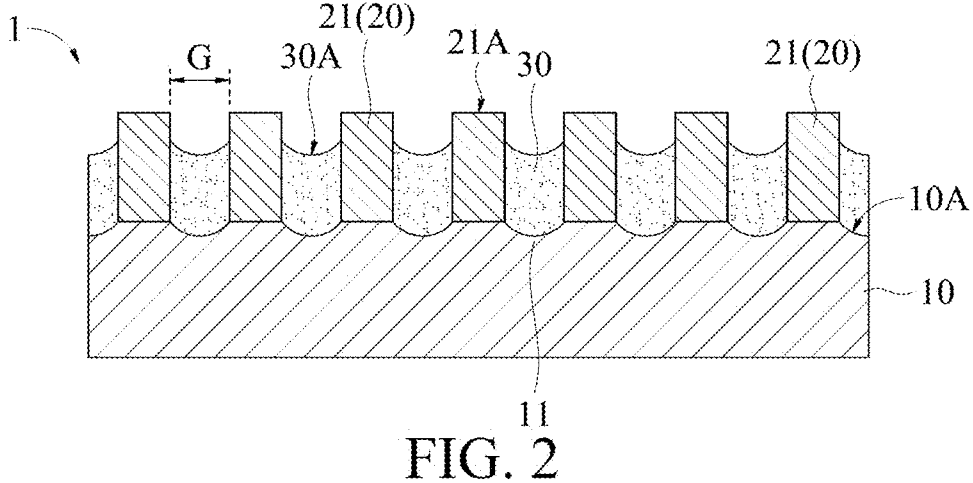
FIG. 2 is a schematic cross-sectional view of a second embodiment of a micro circuit structure.

FIG. 2 is a schematic cross-sectional view of a second embodiment of a micro circuit structure. As shown in FIG. 2, referring to FIG. 1, a difference from the first embodiment is that the circuit pattern 21 in the second embodiment protrudes from the third surface 30A of the fixed layer 30. In other words, the circuit pattern is in a half-buried and fixed form.

Figure 3A:
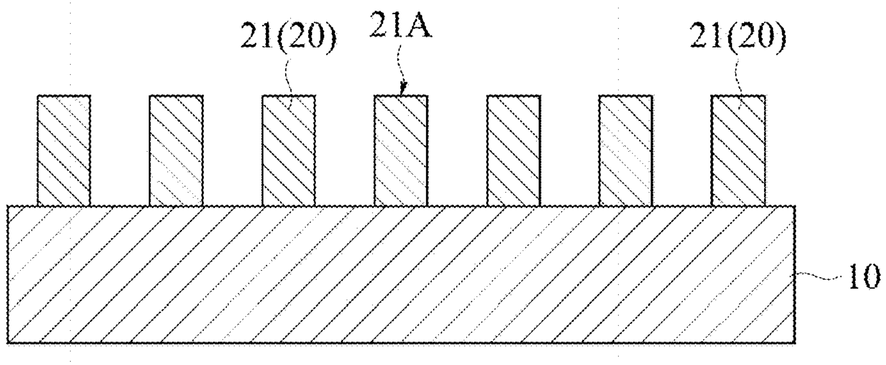
FIG. 3A to FIG. 3E are step-by-step schematic cross-sectional views of a manufacturing method for a micro circuit structure.

FIG. 3A to FIG. 3D are step-by-step schematic cross-sectional views of a manufacturing method for a micro circuit structure. As shown in FIG. 3A, first, a circuit substrate 10 is provided; and then a circuit pattern layer 20 is formed on a first surface 10A of the circuit substrate 10. The circuit pattern layer 20 includes a plurality of circuit patterns 21, and a gap between the circuit patterns 21 is less than 10 μm. In some embodiments, a width of the circuit pattern 21 is less than 10 μm.

Figure 3B:
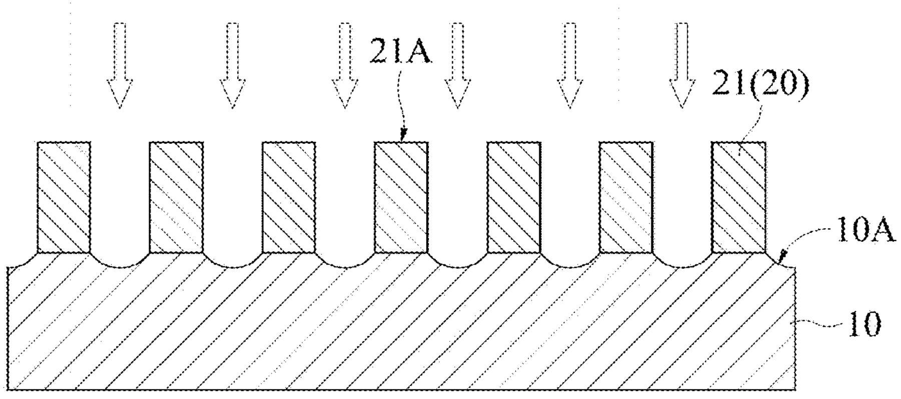
Figure 3C:
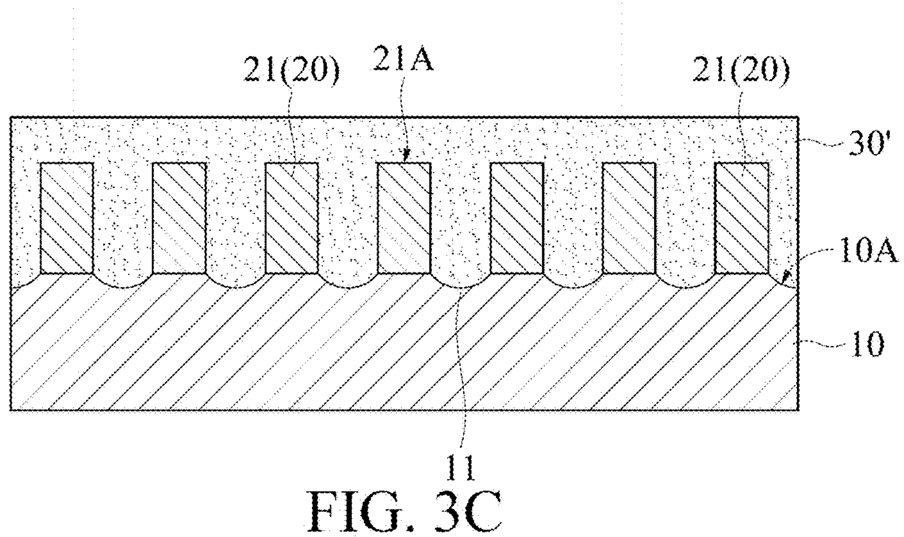

As shown in FIG. 3B, etching is performed between the circuit patterns 21, to remove a part of the first surface 10A, and form a recessed portion 11 between two circuit patterns 21. An etching technology may include a dry etching technology or a wet etching technology. For example, the dry etching technology may use laser etching, plasma grinding, or electron beam etching to remove residual metal films or metal particles through high energy. The wet etching technology is used to etch the circuit substrate 10 based on different chemical properties and remove metal films or metal particles on the circuit substrate. By removing a part of the first surface 10A, the recessed portion 11 is formed, to further restrict electro-migration. Next, as shown in FIG. 3C, a curing material 30' is coated on the circuit substrate 10 and the circuit pattern layer 20, and the curing material 30' is filled between the circuit patterns 21 and in the recessed portion 11. In this case, the curing material 30' can completely cover the circuit substrate 10 and an upper surface of the circuit pattern layer 20. The curing material 30' may be the thermosetting adhesive, the light curing adhesive, or the solder mask.

Figure 3D:
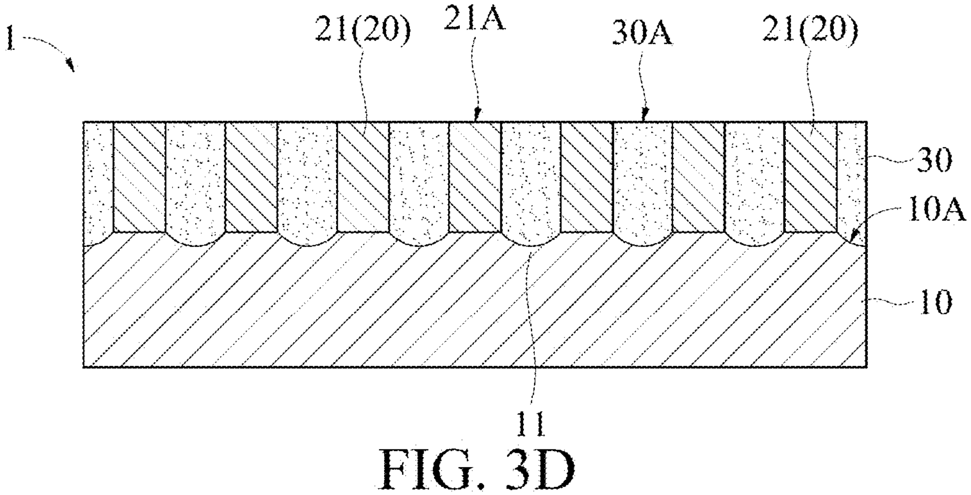
Figure 3E:
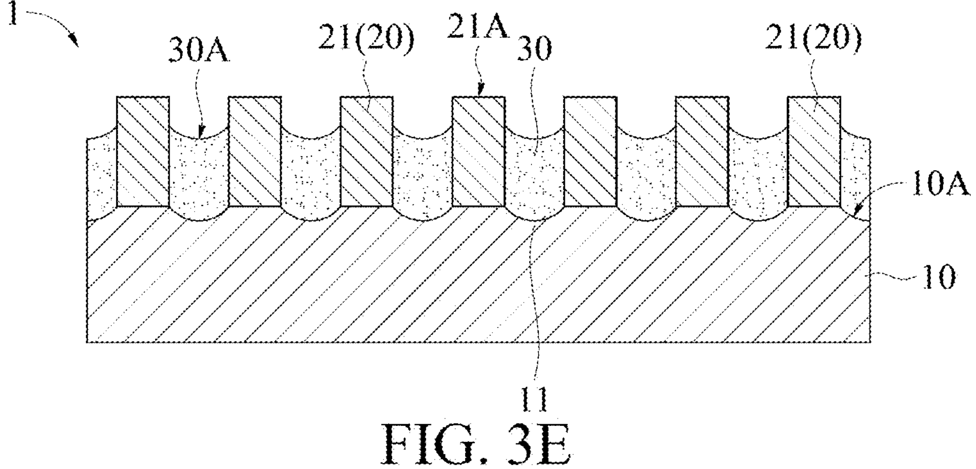

As shown in FIG. 3D and FIG. 3E, after the curing material 30' is cured, a part of the curing material 30' is removed to form a fixed layer 30, so that a second surface 21A of the circuit pattern 21 is exposed to a third surface 30A of the fixed layer 30. In this case, the entire curing material 30' can be thinned in an adhesive removing manner such as grinding, plasma etching, or chemical etching for manufacturing, to form structures shown in FIG. 1 and FIG. 3D. Alternatively, materials between the circuit pattern 21 may be first thinned by grinding and then removed by using plasma or laser, so that the circuit pattern 21 protrudes from the third surface 30A of the fixed layer 30, to form structures shown in FIG. 2 and FIG. 3E.

As described above, by forming the recessed portion 11 between the circuit patterns, residual metal particles or metal films are removed, and a phenomenon of a micro short circuit caused by conduction with the circuit pattern 21 is avoided, and electro-migration is further restricted through a structure of the recessed portion 11.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A micro circuit structure, comprising:

a circuit substrate, wherein a first surface of the circuit substrate has a plurality of recessed portions;

a circuit pattern layer formed on the first surface of the circuit substrate, wherein the circuit pattern layer comprises a plurality of circuit patterns, a gap between the circuit patterns is less than 10 μm, and each of the circuit patterns is located between two recessed portions; and a fixed layer formed on the first surface of the circuit substrate and between the circuit patterns, wherein a second surface of the circuit pattern is exposed to a third surface of the fixed layer.

2. The micro circuit structure according to claim 1, wherein a width of each of the circuit patterns is less than 10 μm.

3. The micro circuit structure according to claim 1, wherein the fixed layer is selected from a group comprising a thermosetting adhesive, a light curing adhesive, or solder mask.

4. The micro circuit structure according to claim 1, wherein the second surface of the circuit pattern is coplanar with the third surface of the fixed layer.

5. The micro circuit structure according to claim 1, wherein the circuit pattern protrudes from the third surface of the fixed layer.

6. A manufacturing method for a micro circuit structure, comprising:

providing a circuit substrate;

forming a circuit pattern layer on a first surface of the circuit substrate, wherein the circuit pattern layer comprises a plurality of circuit patterns, and a gap between the circuit patterns is less than 10 μm;

performing etching between the circuit patterns, to remove a part of the first surface, and form a recessed portion between two circuit patterns;

coating a curing material on the circuit substrate and the circuit pattern layer, and filling the curing material between the circuit patterns and in the recessed portion; and removing a part of the curing material to form a fixed layer, to enable a second surface of the circuit pattern to be exposed to a third surface of the fixed layer.

7. The manufacturing method for a micro circuit structure according to claim 6, wherein a width of each of the circuit patterns is less than 10 μm.

8. The manufacturing method for a micro circuit structure according to claim 6, wherein the fixed layer is selected from a group comprising a thermosetting adhesive, a light curing adhesive, or solder mask.

9. The manufacturing method for a micro circuit structure according to claim 6, wherein the second surface of the circuit pattern is coplanar with the third surface of the fixed layer.

10. The manufacturing method for a micro circuit structure according to claim 6, wherein the circuit pattern protrudes from the third surface of the fixed layer.

11. The manufacturing method for a micro circuit structure according to claim 6, wherein the etching is selected from a group comprising laser etching, plasma etching, electron beam etching, and chemical etching.

12. The manufacturing method for a micro circuit structure according to claim 6, wherein the step of removing the part of the curing material is selected from a group comprising grinding, plasma etching, laser etching, or chemical etching.

* * * * *